US008121826B1

(12) United States Patent
Neely et al.

(10) Patent No.: US 8,121,826 B1
(45) Date of Patent: Feb. 21, 2012

(54) GRAPHICAL USER INTERFACE FOR SYSTEM DESIGN

(75) Inventors: Christopher E. Neely, San Jose, CA (US); Gordon J. Brebner, San Jose, CA (US); Jack S. Lo, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 406 days.

(21) Appl. No.: 12/505,243

(22) Filed: Jul. 17, 2009

(51) Int. Cl.
*G06F 17/50* (2006.01)

(52) U.S. Cl. ............................. 703/14; 717/109; 717/104

(58) Field of Classification Search ................ 703/1, 13, 703/14; 706/11; 710/240; 716/4, 10, 18; 717/104, 108, 109, 114; 370/252
See application file for complete search history.

(56) References Cited

U.S. PATENT DOCUMENTS

| | | | |
|---|---|---|---|
| 6,809,551 B1 | 10/2004 | Wicker, Jr. | |
| 7,573,295 B1 | 8/2009 | Stadler | |
| 2001/0047509 A1* | 11/2001 | Mason et al. | 716/18 |
| 2008/0127065 A1* | 5/2008 | Bryant et al. | 717/109 |
| 2008/0147359 A1* | 6/2008 | Brown et al. | 703/1 |
| 2008/0184184 A1* | 7/2008 | McCracken et al. | 716/10 |
| 2009/0007058 A1* | 1/2009 | Dharmagadda | 717/104 |
| 2009/0055565 A1* | 2/2009 | Latta | 710/240 |
| 2009/0132996 A1* | 5/2009 | Eldridge et al. | 717/108 |
| 2009/0307639 A1* | 12/2009 | Chapman et al. | 716/4 |
| 2009/0307660 A1* | 12/2009 | Srinivasan | 717/114 |
| 2010/0036779 A1* | 2/2010 | Sadeh-Koniecpol et al. | 706/11 |
| 2010/0110916 A1* | 5/2010 | Pratt et al. | 370/252 |

OTHER PUBLICATIONS

U.S. Appl. No. 12/505,239, filed Jul. 17, 2009, Neely et al.
Bergamaschi, R.A. et al., "Automating the Design of SOCs Using Cores," *IEEE Design & Test of Computers*, Sep.-Oct., 2001, pp. 32-45, vol. 18.
Chen, M.K. et al., "Shangi-La: Achieving High Performance from Compiled Network Applications while Enabling Ease of Programming," *Proc. of the 2005 ACM SIGPLAN Conference on Programming Language Design and Implementation*, Jun. 11-15, 2005, pp. 224-236, New York, New York, USA.
International Telecommunication Union *OAM functions and mechanisms for Ethernet based networks*, May 2006, pp. 1-80, ITU-T Y.1731, available from the International Telecommunication Union, Geneva, Switzerland.
Janneck, Jorn, *Notes on an actor language*, Feb. 13, 2007, pp. 1-27, presented at the 7th Biennial Ptolemy Miniconference, University of California at Berkeley, Berkeley, California, USA.
Keller, Eric et al., *Software Decelerators*, Sep. 2, 2003, pp. 1-18. presented at the 13th Annual Conference on Field Programmable Logic and Applications, Lisbon, Portugal.

(Continued)

*Primary Examiner* — Kandasamy Thanagavelu
(74) *Attorney, Agent, or Firm* — Scott Hewett; Lois D. Cartier

(57) ABSTRACT

A design tool for designing a system includes a display device with a first visualization pane showing a symbolic representation of a connection between a first port and a second port of the system and a second visualization pane showing an unconnected port of the system. A text entry pane on the display device shows a textual definition of the connection. An optional status pane shows a textual log of user-performed actions relating to construction of the system.

19 Claims, 4 Drawing Sheets

OTHER PUBLICATIONS

Keller, Eric et al., "Software Decelerators," *Proc. of the 13th International Conference on Field Programmable Logic and Applications*, Apr. 20-23, 2004, pp. 385-395, Napa, California, USA.

Kulkarni, Chidamber et al., "Mapping a Domain Specific Language to a Platform FPGA" *Proc. of the 2004 Design Automation Conference*, Jun. 7-11, 2004, San Diego, California, USA.

Lockwood, John W., "Automated Tools to Implement and Test Internet Systems in Reconfigurable Hardware," *ACM SIGCOMM Computer Communications Review*, Jul. 2003, pp. 103-110, vol. 33, Issue 3.

Morris, Robert et al., "The Click modular router," *ACM SIGOPS Operating Systems Review*, Dec. 1999, pp. 217-231, vol. 33, No. 5.

Shah, Niraj et al., "NP-Click: A Productive Software Development Approach for Network Processers," *IEEE Micro*, Sep.-Oct. 2004, pp. 45-54, vol. 24, No. 5.

* cited by examiner

GRAPHICAL USER INTERFACE FOR SYSTEM DESIGN

FIELD OF THE INVENTION

The present invention relates generally to systems, such as integrated circuit ("IC") systems and software systems, and more particularly to design tools for connecting interfaces between blocks of a system.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

The programming used to configure an FPGA or other PLD is often very complex. It is common to use a modeling system to simulate the operation of the programming to evaluate how a physical FPGA will operate when used in a system, such as a system on a chip ("SoC"). In some systems, a PLD interfaces with or includes functional blocks. For example, an FPGA includes an embedded processor operating at a first clock speed, and an I/O interfacing peripheral and a customized computation peripheral (such as a digital processing or image processing filter) operating at a different clock speed. Multiple simulators are integrated into the modeling system to simulate the different functional blocks. In yet other instances, the PLD devices themselves are used in the simulation as emulators. In this case, a portion of a design physically runs on a PLB device while the rest of the design is simulated by the simulators running on a host PC. A modeling system interface controls the simulation progress of the software simulators or emulation hardware, and exchanges simulation data between them when needed.

System level design requires the ability to quickly connect and adapt compatible components (blocks) together. Connections between components are typically made thorough ports of the components. Conventional design approaches are often highly iterative, since one type of port might not be compatible with the type of port on the corresponding component. IC systems are typically defined as descriptions of components and ports, wherein data flows and control interactions between the components are described in sufficient detail to accurately model IC system performance in an IC simulator (e.g., a dedicated IC design and simulation tool (i.e., a limited-use type of computer) or a general purpose computer configured to run IC simulation software and output simulated IC results).

CLICK is a dataflow language that treats software-based design elements in a software system as a specialized network and uses modular description language familiar in the field of networked systems. The concise yet highly detailed syntax requirements of CLICK makes its commands very powerful for handling packet data flow. However, an IC system has many types of ports (as could some software systems). An IC system designer needs high familiarity with components to specify the names of ports and match their types against that of other ports when forming connections. While CLICK is a valuable tool for designing complex systems, additional functionality in a system design environment for designing IC systems and software systems having multiple port types is desirable.

SUMMARY

A design tool for designing a system includes a display device with a first visualization pane showing a symbolic representation of a connection between a first port and a second port of the system and a second visualization pane showing an unconnected port of the system. A text entry pane on the display device shows a textual definition of the connection. An optional status plane shows a textual log of user-performed actions relating to construction of the system.

DETAILED DESCRIPTION

Figure 1:
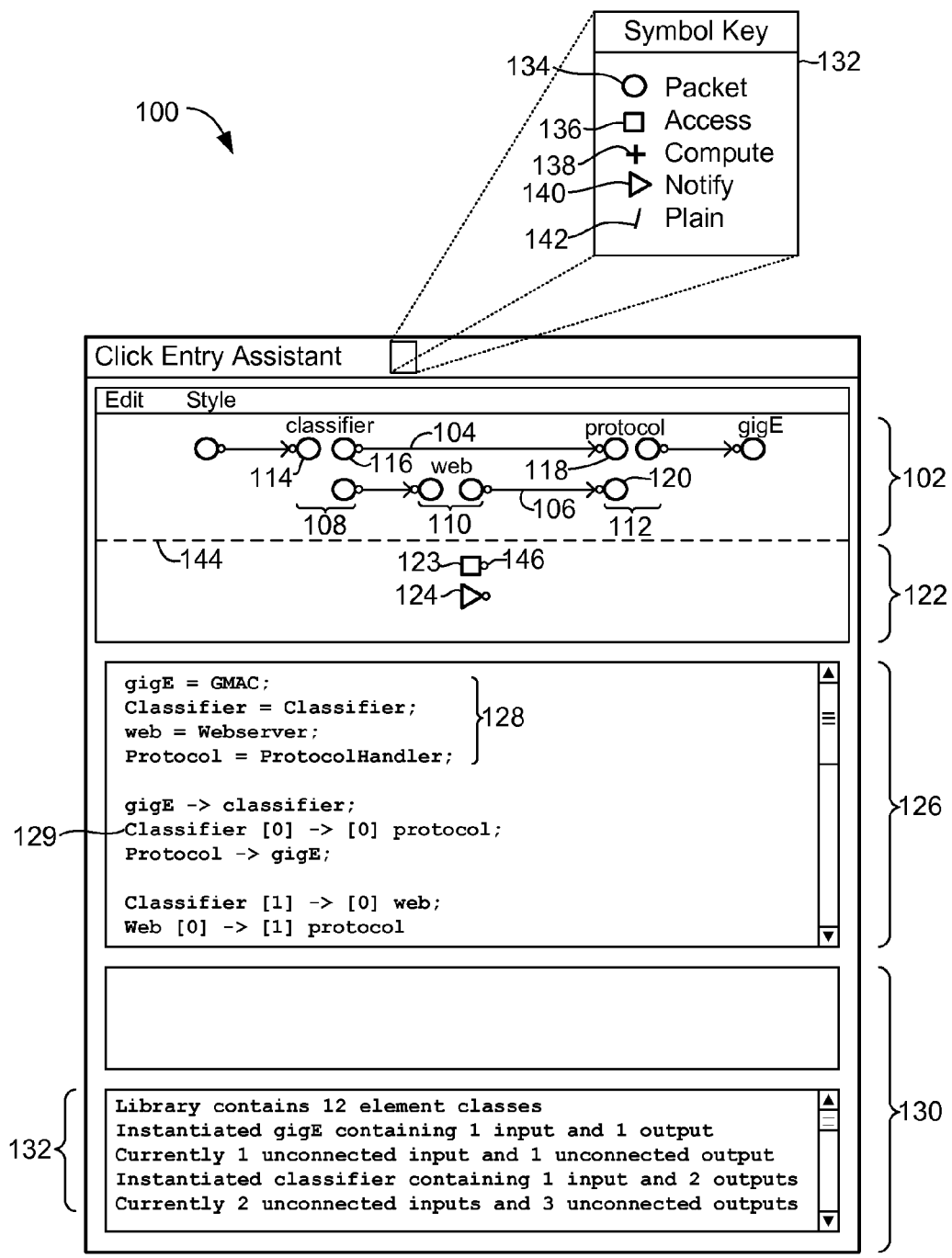
FIG. 1 is a diagram of a display device illustrating a user interface 100 according to an embodiment.

In a conventional design methodology, a user writes a design based on a top-down design methodology. An abstract functional description of the system, or a list of system requirements, is decomposed into modules (which are typically one or more components) according to function. Elements are selected from a library to implement the system functions based on the element descriptions. The user chooses how to connect the elements according to their interfaces. The user verifies that the IC system design is correct by compiling the design and running one or more simulations. An error in connecting an interface, or omitting a critical connection, can cause the simulation to fail and require a modification of the design.

Extensions have been made to the CLICK environment, which will be referred to as CLICKPLUS, that provide a language for describing a system as a network containing interconnect modules. CLICKPLUS extends CLICK-type functionality to include support for control flow connections to non-software elements, such as memories and peripheral devices, which makes CLICKPLUS practical and desirable as a design-entry environment for producing hardware solutions (i.e., IC systems) incorporating such elements, as are often includes in an FPGA-based system. Similarly, CLICKPLUS extends functionality to support control flow connections in software systems having a number of different port types (e.g., ports other than packet data flow ports).

A feature of CLICKPLUS is that is has a set of abstract interface types for ports that are grouped according to functional characteristics, such as a pattern of communication and style of use. While being very powerful, the set of interface types complicates the writability of the language because the designer must keep track of which interface types need to be connected. A CLICKPLUS description contains a textual graph of connected elements with connections between compatible ports of various interface types. Keeping track of port compatibility is important, as failure to do so can result in an incomplete or inaccurate design.

CLICKPLUS is IC design environment that allows IC system or software network design engineers connect components (also known as blocks), which can be software applications, peripheral devices (e.g., memory), IP cores, and dedicated (i.e., "burned" silicon) circuits. CLICKPLUS uses connection statements that allow connections between components to be arbitrarily arranged within the system description (model or configuration file). However, the flexibility of the description statements impute user knowledge of not only the type of connections being made, but also the type and number of connections (ports) on each component. Failure to account for a connection or an attribute of a connection can result in a failed system design or simulation.

Techniques according to embodiments address this problem by providing real-time assistance to the circuit designer. One type of assistance is to display not only the connections made to a component, but also the remaining connections (including connection type) of the components. In a particular embodiment, a display device, such as a display screen of an IC design tool, a circuit simulator, or a general purpose computer programmed to perform one or more embodiments, displays connections between components in one portion of the display screen, and remaining (i.e., available or required) connections in another portion of the display screen.

In a further embodiment, the connection type is identified by a shape or color. CLICKPLUS allows non-packet interfaces between components, such as access, compute, notify, and plain interfaces. An embodiment operating in a CLICKPLUS environment can identify the types of ports (interfaces) using a corresponding number of symbols, which may be unique symbols, or use color differentiation to identify port types. Different embodiments may use different types of ports, for example, a particular IC system or software system might be fully defined with five port types and five port type symbols, while another system is fully defined with greater or fewer port types and port type symbols.

Showing port types in a display of a design tool used by a user to design an IC or software system leads the user to specify the proper, complete connections between components. In a further embodiment, suggestions for connections between components are automatically made in real time. For example, if the user makes a compute connection to a logic block of a component, the design tool automatically indicates that a notify connection may also be required for that component. This frees the system designer from keeping track of the minutiae of each port type, and insures that the detailed attributes of each interface are correctly matched. Visually displaying both the connections and available (unconnected) ports allows the designer to more easily gauge the completeness of his design. The visual emphasis on connected and unconnected ports (i.e., on data flow and control flow) is more efficient than scanning a traditional schematic diagram as the IC system is built-up, because the user must typically scan the entire diagram to identify the ports still requiring connection. Embodiments provide a design environment that helps an IC system designer write a design that is more correct and complete by construction.

In a still further embodiment, text descriptions (e.g., classic CLICK-type text entries) are displayed in a pane (e.g., "CLICK-PLUS pane") on the screen along with the connections and unused ports. In a further embodiment, typing aids, such as auto-completion and syntax checking insure proper and complete entry of the connection descriptions. For example, when a component is selected, a pop-up box showing the unused ports (including the port type(s)) allows a user to click on the port he wishes to make a connection to, and the port description is automatically entered in the CLICKPLUS pane.

I. An Exemplary User Interface

FIG. 1 is a diagram of a display device illustrating a user interface 100 according to an embodiment. The display device can be a display screen of an IC system design tool or computer, for example. The display shows four panes: a first visualization pane 102 showing connections 104, 106 between components 108, 110, 112, having ports (interfaces) 114, 116, 118, 120; a second visualization pane 122 showing unconnected ports 123, 124 of a component 110; a text entry pane 126 wherein port statements 128 (also known as port descriptions or port definitions) are entered, either by the user from a keypad or as auto-text by the design tool according to the type of connection implemented in the first visualization pane 102; and a status pane 130 that shows a log 132 of the actions the user has performed to construct the system model. In one example, the user enters a textual definition (e.g., a CLICKPLUS port description) 129 of a connection 104, which gets interpreted into actions that incrementally build the underlying system model and display the system connections as they are entered. The design tool automatically checks the system model against the port information within the library of elements to determine the compatibility of each connection.

A pop-up or pull-down window 132 provides a menu of interface types. In a particular design environment for an FPGA-based IC system, five types of interfaces were defined, each identified by a symbol: 1) packet (which is the standard interface type used in CLICK environments) 134, 2) access 136, 3) compute 138, 4) notify 140, and 5) plain 142. Other IC systems may have more or fewer interface types. Each interface has attributes common to the components associated with that interface type(s).

In a particular embodiment, specific shapes are chosen to be associated with each interface type. In this example, packet interfaces are represented as a circle, access interfaces are represented as a square, compute interfaces are represented as a plus sign, notify interfaces are represented as a triangle, and plain interfaces are represented as a forward slash mark. The shapes are somewhat arbitrary, with the proviso that the shapes are easily distinguished from each other. In further or alternative embodiments, colors (or grayscale in a monochrome display system) are used to distinguish interface types, or inter-face sub-types. In yet other embodiments, additional features, such as following or preceding modifiers (e.g., a small circle or a perimeter ring) are added to the basic interface shape to distinguish a shape type (e.g., whether a packet interface is operating as a receiving or transmitting port). In yet further embodiments, interfaces or connections (i.e., arrows) are animated to indicate a special attribute, such as if an interface on a particular element (block) requires additional attention, such as connection to another port on the element. Animation techniques, such as Piccolo ZUI, available from the Human Computer Interaction Laboratory of the University of Maryland, are known to those of skill in the art of computer display techniques.

The visualization panes 102, 122 give an indication of progress while writing the design as well as an indication of the overall completeness of the description. A dotted horizontal line 144 separates the ports that have been connected 114, 116, 118, 120 in the upper portion 102 from the ports that have not yet been connected 123, 124 in the lower portion 122. This way, the user can quickly see what remains by scanning the ports remaining below the line 144, which is more efficient and complete compared to performing a conventional two-dimensional scan over a traditional schematic, where a scan over the entire diagram is performed to determine what ports remain unconnected.

The port symbols for elements appear drawn in two columns at the time the user types the instantiation of an element (see, e.g., FIG. 2); thus, the user is provided with a visualization of connectivity for the element in real time. The ports are arranged with inputs in the left column and outputs in the right column, and separate symbols (e.g., rectangles) for the elements are omitted, as it is the connectivity for each element that is of interest. However, alternative embodiments arrange the displayed elements and ports in a different fashion. For example, an alternative embodiment includes separate symbols for the element.

A small circle 146 is optionally added to the right or to the left of each symbol to help indicate whether it is an input or output. The sets of ports are drawn in columns going left to right as elements are instantiated. Each row above the line 144 corresponds to a line of CLICKPLUS that the user typed in the entry pane 126. At the time the user forms a connection, port symbols are moved down into new rows if they are not used in the connection, so that anything unconnected rests below the horizontal line 144. Symbols that are used in the connection are then connected by arrows 104, 106 and their position is animated (if necessary) so that they fit the order from the connection statement.

Selection of interface types was based on characterizing an FPGA-based streaming system. This represented a convergence of three paradigms: 1) register transfer level ("RTL") programming, 2) communications programming, and 3) procedural programming. Each interface type can be viewed as embodying a programmed protocol that describes the inter-module interaction over the interface. The protocols are programmable in the sense that they allow one to describe variations in behavior. A tree of behavioral attributes for each interface type helps to describe important protocol differences feature-wise at a high level, eliminating the need for exhaustive checking of possible protocol state compositions between communicating modules. The different interface types form a layered communication model that builds on functionality at lower layers.

In a particular embodiment, RTL programmed interfaces form the base layer. A "plain" interface type is the basic fall-back option when selecting an interface type because plain has no prescribed semantics. The data format of a plain interface is a simple bit-vector. A plain interface type is used where the interface does not appear to fit in one of the listed categories or when the type is not specified.

In networking, a key distinction is made between connection-oriented communications and connectionless communications. In connectionless communication there is very low overhead, and often the sender and receiver are required to be in synchrony. If the receiver is not ready to receive the message, there is the risk that it might be lost. Connection-oriented transmissions can be viewed as analogous to telephone networks or ATM networks, where the connection is established often as a stateful path providing end-to-end service. In both communication types, the general data messages may be formatted as a collection of values or symbols, e.g., often consisting of structured data type.

A "notify" interface type provides the transmission of a message between two modules, as an atomic data unit, implemented using basic signals as provided by a plain interface type. A notify interface type signals that some event has occurred. This is in the form of some representation of the event that occurred and may include a datagram description or identifier for the event. Notify transmissions do not support flow control.

A "packetstream" type interface adds support for flow control and error-handling between the modules. A packetstream interface is appropriate for peer modules that stream data in a dataflow manner with a stateful context for the duration of the stream. A packet-type interface is used for transferring network datagrams between components, where the packets have some headers which perhaps come from multiple layers of protocols. The basic functions are transmit and receive.

"Access" and "compute" interface types are procedural programming interface types. Access and compute interfaces are layered on top of the atomic data transfers represented by a notify interface type. Both protocols have a command request phase, a wait phase, and a command response phase. An access type interface provides an interface to read and to write to stateful storage (e.g., a shared memory).

A compute type interface supports procedure calls to a procedure implemented in logic or in software (for example, procedures mapped to embedded processors, commonly referred to as software decelerators). A compute type interface calls functions from other elements. The functions can accept some parameters as arguments and return some value as a result. Together, access and compute interfaces capture the two fundamental features of procedural programming: variable accessing and function calling.

The syntax of CLICKPLUS allows for the identifiers of ports to contain more than just integer values, particularly for interfaces other than packet. An example of this is shown in the example CLICKPLUS description below:

gigE:: GMAC;
    classifier:: Classifier;
    web:: Webserver;
    protocol:: ProtocolHandler;
    gigE→classifier;
    classifier [O_ARP I→[0 Jprotocol;
    protocol→gigE;
    classifier [1_HTTP J→[O_REQ Jweb;
    web [O_OUT J→[1 Jprotocol;

The example above shows that port types do not appear at the CLICKPLUS level of description, and instead are specified as meta-data. Such information would help the reader in this context to see whether or not the connections are properly formed. Statements in CLICK are independent, thus the ordering of connections is not necessarily based on the adjacency of port. Furthermore, some elements may be artificial in terms of their dataflow, depending on how they are used in a system. For example, a "protocol wrapper" element can logically have two separate functions, such as a bi-directional bridge between two protocols (e.g., A to B, and B to A). In such an instance, an element might have a connection path that feeds back to itself to perform the reverse direction bridging.

Figure 2:
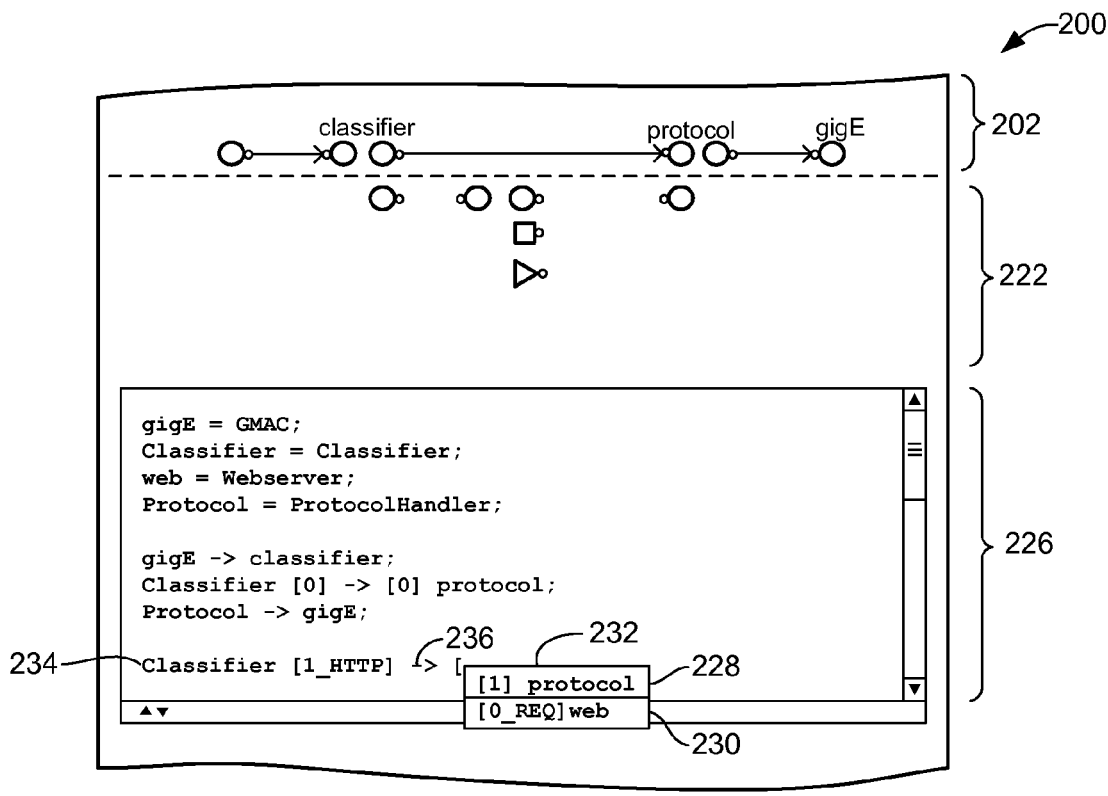
FIG. 2 is a diagram of a display device with an entry pane illustrating auto-fill according to an embodiment

FIG. 2 is a diagram of a display device 200 with an entry pane 226 illustrating auto-fill according to an embodiment.

The entry pane 226 operates in conjunction with the visualization panes 202, 222 as described above in reference to FIG. 1, and precedes FIG. 1 in terms of system design. The entry pane 226 is a text editor area where the user types in descriptions of interfaces or connections (e.g., ref. num. 234). The entry pane 226 suggests port names 228, 230 in a pop-up context menu 232 as the user is typing the element interface description 234. When the user selects a port from the context menu (e.g., [O_REQ] web), the text in the description is automatically generated and inserted at the text cursor position (Compare, FIG. 1, ref. num. 126). Only unconnected ports of an element (block) are suggested in the pop-up context menu 232, and when the user is prompted for a corresponding port on the right hand side of a connection arrow 2236 in the entry pane 226, the context menu 232 suggests only ports 228, 230 of the appropriate type. Upon completion of the connection in the entry pane (i.e., when the user selects a port from the context menu or otherwise enters the rest of the connection description), the visualization panes 202, 222 are automatically updated (compare, FIG. 1, ref. nums. 102, 122).

Figure 3:
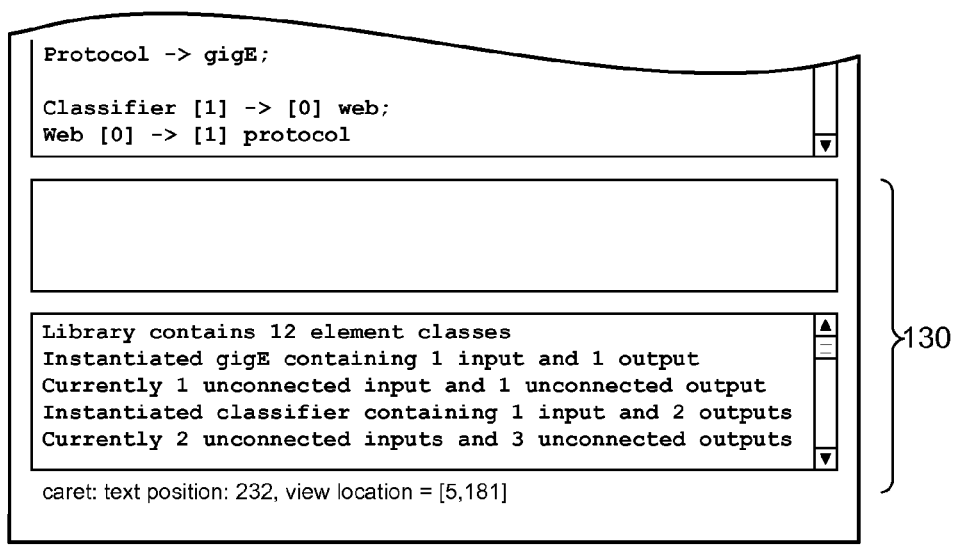
FIG. 3 is a diagram of a status pane according to an embodiment.

FIG. 3 is a diagram of a status pane 130 according to an embodiment. The status pane 130 provides an activity log that shows an incremental record of how the user has constructed the system model. The activity log has statements for each action; with the number of unconnected ports remaining in the design after each action is performed. The status pane 130 is another place to indicate if there are errors detected in the design with an error or warning message. This is also a place to print summary messages about the library of elements and also to provide any resource estimates for the design.

II. An Exemplary Design Tool

Figure 4:
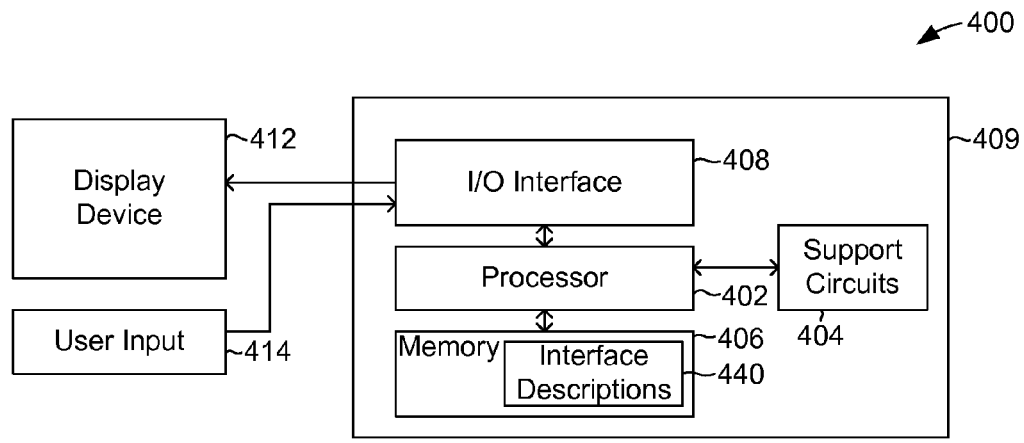
FIG. 4 is a diagram of an IC system design tool according to an embodiment.

FIG. 4 is a diagram of an IC system design tool 400 according to an embodiment. The design tool 400 includes a central processing unit (CPU) 402, a memory 406, support circuits 404, and an I/O interface 408, typically integrated in a computer 409 or similar machine. The support circuits 404 for the CPU 402 include conventional cache, power supplies, clock circuits, data registers, and I/O interfaces, for example. The I/O interface 408 may be directly coupled to the memory 406 or coupled through the CPU 402, and may be coupled to a user input device 414, such as a keyboard, stylus pad, or mouse, and interface circuitry adapted to receive and transmit data, such as CLICK-type interface definitions (command strings). The I/O interface 408 is coupled to a display device 412, such as a screen or other output device, and a user can input commands and data through an input device 414, such as a keypad, mouse, or stylus for inputting textual descriptions into an entry pane (see, FIG. 1, ref. num. 122) which are rendered as a connectivity map (see, FIG. 1, ref. num. 102) on the display device 412 according to instructions stored in memory 406. The memory 406 could also store a compiler used to create a program or configuration file for another machine (e.g., a different design tool) or the same computer system that is executing the compiler. The display device 412 also shows the remaining unconnected ports (see, FIG. 1, ref. num. 114) for elements, which typically have descriptions stored in memory 406. Some embodiments incorporate a touch-screen that operates as both a display device and as an input device.

The memory 406 stores one or more programs or data to implement one or more embodiments. Although exemplary embodiments of the invention are disclosed as being implemented as a computer executing a software program, those skilled in the art will appreciate that the invention may be implemented in hardware, software or a combination of hardware and software. Implementations may include a number of processors independently executing various programs and dedicated hardware, such as application specific integrated circuits (ASICs).

The design tool 400 may be programmed with an operating system, such as OS/2, Java Virtual Machine, 10 Linux, Solaris, Unix, Windows, Windows95, Windows98, Windows NT, and Windows2000, WindowsME, or WindowsXP. At least a portion of an operating system is stored in the memory 406, which may include random access memory, read-only memory, magneto-resistive read/write memory, optical read/write memory, cache memory, or magnetic read/write memory. The memory 406 stores all or a portion of one or more user interface definitions 440 according to one or more embodiments.

In comparison to a system schematic diagram, the higher levels of abstraction and automatic completion features used in embodiments improve efficiency and usefulness for IC system connectivity. Embodiments allow a user to easily connect ports on a system element to the proper number and type of ports on other system elements.

III. An Exemplary IC System Design

This following listing presents a design example of an embodiment using CLICKPLUS. The system here provides hardware acceleration of time-critical functions needed for Ethernet operations, administration and maintenance ("OAM"), as described in the ITU-T Y.1731 and IEEE 802.11ag standards. Fast line rates in excess of 1 Gbit/second use accelerated implementations of functions that had previously been done in software. The example below describes an implementation of these functions for Y.1731 performance monitoring and IEEE 802.11ag connectivity fault management. The modules used in the system were derived from differing unit design processes.

Program 1 Ethernet OAM: Y.1731 and CFM Example:
1. /*Section1: Declare element instances*/
2. y1731_classifier_in:: VlanClassifier("TYPE G");
3. y1731_classifier_out:: VlanClassifier("TYPE G");
4. y1731_in:: OAM_Y1731_In("TYPE G");
5. y1731_out:: OAM_Y1731_Out("TYPE G");
6. cfm_in:: CheckCcm("TYPE G");
7. cfm_out:: GenerateCcm("TYPE G");
8. preread:: CalcAddress("TYPE G");
9. start1:: Start("TYPE VHDL");
10. finish1:: Finish("TYPE VHDL");
11. frameReader1:: FrameReader("TYPE VHDL");
12. timerefs1:: TimeRefs("TYPE VHDL");
13. contextIDs:: ContextsIdTable("TYPE VHDL");
14. vlanProfiles:: VlanProfileTable("TYPE VHDL");
15. melContexts:: MelContextsMem("TYPE VHDL");
16. controller:: EmbeddedController("TYPE C");
17.
18.
19. /*Section 2: Main forwarding path*/
20. From Device(LineSide)→[P_in]y1731_classifier_in[P_out]
21. →[P_in]y1731_in[P_out]
22. →[P_in]cfm_in[P_out]
23. →ToDevice(SystemSide);
24.
25. /*Generates CCM Frames*/
26. start1[N_out]→[N_in]preread[N_out]
27. →[N_in]frameReader1[P_out]
28. →[P_in]cfm_out[P_out]
29. →[P_in]y1731_classifier_out[P_out]

```
30.  →[P_in]y1731_out[P_out]
31.  →ToDevice(LineSide);
32.
33.
34. /*Section3: Auxiliary connections*/
35. /*Resets timer if CCM arrives*/
36. cfm_in[C_request]→[C_request]finish1;
37.
38. /*Connections to (e.g.) IEEE 1588 Time Reference*/
39. y1731_in[A_time]→[A_time1]timerefs1
40. y1731_out[A_time]→[A_time2]timerefs1;
41. start1[A_time]→[A_time3]timerefs1;
42. finish1[A_time]→[A_time4]timerefs1;
43.
44. /*Connections to Shared Memory/Tables*/
45.  y1731_classifier_in[A_pTbl]→[A_pTbl1]vlanProfiles;
46.  y1731_classifier_out[A_pTbl]→[A_pTbl2]vlanProfiles;
47. y1731_classifier_in[A_cTbl]→[A_cTbl1]contextIDs;
48.  y1731_classifier_out[A_cTbl]→[A_cTbl2]contextIDs;
49. y1731_in[A_mTbl]→[A_mTbl1]melContexts;
50. y1731_out[A_mTbl]→[A_mTbl2]melContexts;
51.
52. /*Embedded controller connection*/
53. cfm_in [C_defects]→[C_report_defect] controller
```

The system description is organized into three sections. In the first section, the modules are instantiated. The second section highlights the main forwarding data paths between the system-side and line-side network interfaces. The third section shows inter-module connections with non-streaming interface types. In the first section, several modules are instantiated, which include packet processing modules coded in the G language, auxiliary libraries coded in very high-level description language ("VHDL"), and a embedded controller function coded in the C language.

For example, line 2 instantiates a new module instance named "y1731_classifier_in", from the library class "VlanClassifier", and with configuration string "TYPE G" (indicating that the language that it is programmed in is G). In general, the configuration string capability is analogous in structural VHDL to the portion of the component instantiation and generic map but without the port map portion. One use of the programming language indication for each module is to allow automatic top-down instantiation of complete systems, by calling sub-tools that process the individual modules (which are treated as "black boxes" by the designer).

The second section shows the main forwarding data flow between the system-side and line-side network interfaces, each as a directed pipeline of modules. For example, on line 20, "→" is a connection operator, meaning "form a connection from FromDevice(LineSide) to a streamingpacket interface P_in on y1731_classifier_in". This corresponds to direct data flow between these two modules and helps to make the description more readable and hence maintainable, without the need to draw a block diagram.

Much background information lies behind each arrow in the CLICK description. In particular, there are the details of attribute values for each interface on the connection, used for type checking to ensure safe connection between compatible ports on modules. This information is contained in a separate Element Description Language ("EDL") description for each type of module included in the design. In one embodiment, an extension to CLICK syntax is made to modify port identifiers to be alphanumeric, whereas original CLICK syntax uses only integer identifiers for ports. Larger changes were made to the semantics of the CLICK environment to allow ports to have other interface types than just streaming-packet, such as in a CLICKPLUS environment.

In the example above, port names include a Hungarian notation prefix for better readability, to indicate the interface type as: P=Packet-Stream, A=Access, C=Compute, N=Notify, and B=Plain. The semantics of the interconnection arrow between elements has changed from CLICK to CLICKPLUS. In its original form, an interconnection arrow just indicated data flow from one element along the arrow to another. In CLICKPLUS, the meaning is generalized so that it represents a control relationship, from a master along the arrow to a target.

In lines 20-23, a packet that arrives on the line-side interface is first classified and then forwarded to "y1731_in" to perform incoming OAM-related processing. Next, the packet is forwarded to "cfm_in" to check for particular defect conditions. Finally, the packet is forwarded for output transmission to the system-side interface. This is a full connection-oriented stream between two end-points. This description shows clearly a main data flow through the system, at a high level of abstraction that does not have any confusing implementation detail. Tools are used to flesh out this detail for the user, as described in the next section.

In the opposite path, lines 25-31, a time-triggered library module "start1" sends notify event messages, for example, every 3.3 ms to pre-read, which calculates the base address for a frame stored in memory. The base address is inserted into the event message and forwarded to the "frameReader", which pulls the frame from memory and forwards it on its output streaming-packet interface. This path illustrates a more sophisticated use of the interface types, here where the system reacts to an event from a timer in order to generate new activity on a packet stream.

There is no inherent notion of time in CLICK descriptions, any such notion deriving from the behavior of specific system modules. In a CLICKPLUS library used in an embodiment, a set of programmable time modules provide mechanisms for starting activities, supplying timestamps, and also timing-out activities that do not finish by their deadline. In the library, these modules are respectively named: Start, Stamp, and Finish. In this design, "start1" is used to generate the time-triggered events for packet generation.

The third section shows other connections that are made, and these illustrate use of the other, procedural, interface types. For example, lines 39-42 show connections to an interface for reading timestamps that are added to certain frames. Lines 44-48 show connections to different lookup tables, and lines 49-50 to a stateful storage array. These connection examples are very much like the connections one would expect to be shown in a block diagram.

On line 53, if the "cfm_in" module detects a defect condition then it reports it by making a "report_defect" function call to the embedded controller. The compute interface provides much design abstraction here because in most hardware description languages one would expect to see an explicit processor and bus connections to describe the co-design interaction. This concisely describes the communication between the procedure caller and callee, analogous to a network remote procedure call (RPC). Overall, the various inter-module connections indicate the very uniform type of system description that is offered through CLICKPLUS. Different modules with differing implementations (e.g., hardware or software) and with differing interfacing are presented in a standard way.

The example description shown above was used in a real IC system design, both to allow high-level system simulation of packet flows through the system by interpretation of the CLICKPLUS description, and to enable RTL generation of the complete system followed by synthesis, place and route for an FPGA.

IV. An Exemplary Method of Designing an IC System

Figure 5:
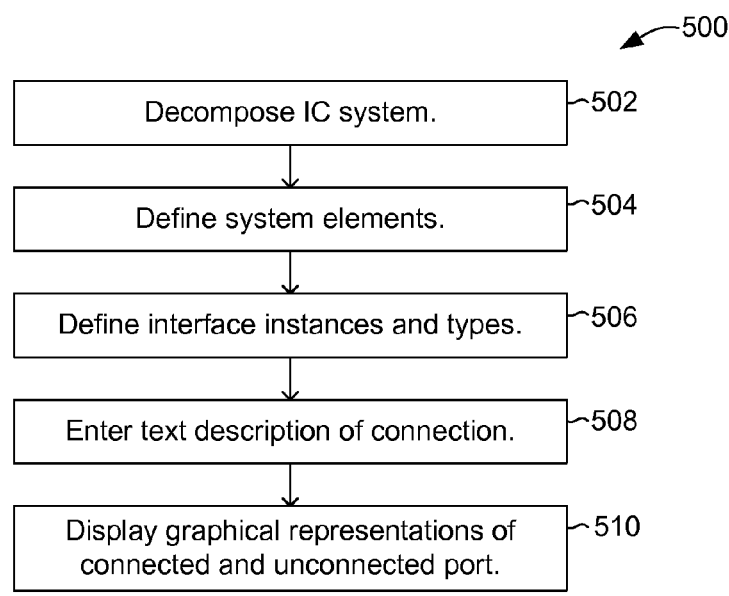
FIG. 5 is a flow chart of a method of designing an IC system according to an embodiment of the invention.

FIG. 5 is a flow chart of a computer-implemented method 500 of designing an IC system according to an embodiment of the invention. Using a computer, the IC system is decomposed into a plurality of system elements (also known as modules or blocks) (step 502), and a library of system elements is defined (step 504). Port (interface) instances and types are defined for at least two of the system elements (step 506). The system element and port definitions are typically stored as computer-readable instructions in a computer-readable device or a memory of a computer system or design tool.

A first connection between a first system element and a second system element is entered as a textual description (step 508). A graphical representation of the first connection is displayed in a first visualization pane and a graphical representation of unconnected ports of at least the first system element is displayed in a second visualization pane adjacent to the first visualization pane on a display device of an IC design tool (step 510). In a particular embodiment, the first connection is displayed as an arrow between the ports. In a particular embodiment, the connected and unconnected ports for the first system element are aligned in a vertical fashion. In a further embodiment, the connected and unconnected ports for each system element represented in the display are aligned in a columnar fashion.

In a further embodiment, each type of port is represented by a corresponding type of symbol according to behavioral attributes of the port types. For example, in a system with five types of ports (e.g., four pre-defined port types and a general port type being defined by the user), five distinctively different symbols are used. In a further embodiment, entering a first portion of the first connection automatically activates a pop-up context menu listing the unused ports of the second visualization pane suitable for connection for connection to the first half. In a yet further embodiment, clicking on one of the ports in the context menu automatically enters text for completion of first connection statement, i.e., automatically enters text for a remaining portion of the connection statement.

V. An Exemplary IC System

Figure 6:
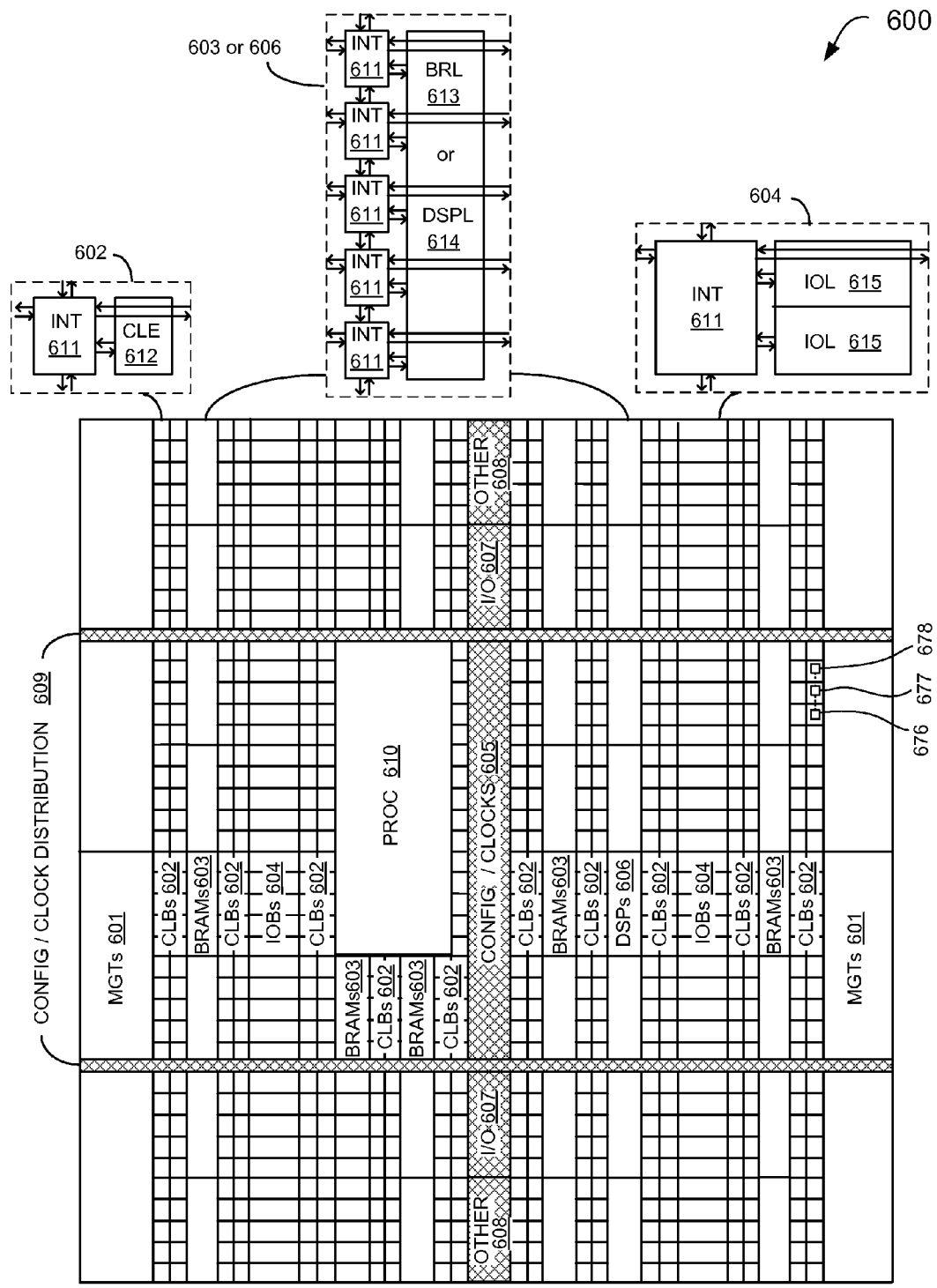
FIG. 6 is a plan view of an FPGA 600 configured as an IC system designed according to an embodiment.

FIG. 6 is a plan view of an FPGA 600 configured as an IC system designed according to an embodiment. The FPGA 600 includes CMOS portions in several of the functional blocks, such as in RAM and logic, and is fabricated using a CMOS fabrication process. The FPGA is configured to have at least one interface 677 between elements (blocks) 676, 678. In a typical application, there may be several interfaces between blocks. Similarly, while it may be possible to connect two blocks using a single interface, it's more likely that the user blocks and interface(s) use several CLBs. A typical CLB has many embedded interconnects, and hence and embodiments may have many embedded interconnects. One of ordinary skill in the art of FPGAs will appreciate that the blocks and interfaces shown in FIG. 6 are simplified for purposes of illustration.

The FPGA architecture includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615. In the pictured embodiment, a columnar area near the center of the die (shown shaded in FIG. 6) is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, although specific embodiments are described in terms of specific IC system design environments and design tools, alternative embodiments apply. For example, while exemplary embodiments have been described in a CLICK-type modular description language, alternative embodiments may use other network description languages. Therefore, the spirit and scope of the appended claims should not be limited to the foregoing description.

What is claimed is:

1. A design tool for designing a system, comprising:
   a display device displaying a user interface including
      a first visualization pane showing a symbolic representation of a first connection between a first port of a first element of the system and a second port of a second element of the system as a first port symbol, a second port symbol, and a connector symbol;
      a second visualization pane showing a first unconnected port of the first element of the system as a third port symbol; and
      a text entry pane showing a textual definition of the first connection.

2. The design tool of claim 1, wherein the system is an integrated circuit system.

3. The design tool of claim 1, wherein the system is a software system.

4. The design tool of claim 1, further comprising:
   a window selectively displayed on the display device providing a menu of a plurality of interface type symbols representing a corresponding plurality of interface types according to behavioral attributes of the interface types.

5. The design tool of claim 4, wherein the plurality of interface type symbols includes a symbol representing a predefined interface type and a symbol representing a general interface type.

6. The design tool of claim 4, wherein the plurality of interface type symbols includes a first symbol representing a packet interface type, a second symbol representing an access interface type, a third symbol representing a compute interface type, a fourth symbol representing a notify interface type and a fifth symbol representing a general interface type.

7. The design tool of claim 6, wherein the general interface type is a user-definable interface type.

8. The design tool of claim 7, wherein a first general interface type is defined as a bit-vector.

9. The design tool of claim 1, wherein the third port symbol of the first element of the system is arranged on the displayed second visualization pane in a columnar fashion relative to the first port symbol of the system.

10. The design tool of claim 1, wherein the first port symbol is of a first interface symbol type and the second port symbol is of the first interface symbol type.

11. The design tool of claim 1, further comprising a status pane showing a textual log of user-performed actions relating to construction of the system.

12. The design tool of claim 1, wherein the user interface further includes a context menu associated with the text entry pane, the context menu being displayed according to a first portion of the textual definition being entered into the test entry pane by a user, the context menu displaying unused ports compatible for connection to the first portion of the textual definition.

13. A computer system including memory storing computer-readable instructions for configuring the computer system to operate as the design tool of claim 1.

14. A computer-implemented method of designing a system, comprising:
   providing a library of system elements of the system, the system elements causing a computer to perform operations including:
      defining interface instantiations for at least two system elements according to behavioral attributes of interface types in a system design tool, the interface types including at least two interface types;
      entering a first text description of a first connection between a first port of a first element of the system and a second port of a second element of the system into the system design tool;
      displaying the first text description in a text entry pane on a display device of the system design tool; and then
      displaying a first port symbol of a first interface type representing the first port, a second port symbol of the first interface type representing the second port, and a connection symbol between the first port symbol and the second port symbol in a first visualization pane of the display device, and
      displaying a third port symbol representing a third port of the first element on a second visualization pane of the display device being adjacent to the first visualization pane, the third port being a first unconnected port of the first element.

15. The method of claim 14, wherein the third port symbol represents a second interface type of the first element and is graphically distinctive from the first port symbol.

16. The method of claim 14, wherein entering a first portion of the first connection defines a port and activates a context menu on the display device indicating unconnected ports in the second visualization pane suitable for connection to the port.

17. The method of claim 16, wherein the operations further include:
   selecting an unconnected port from the context menu, wherein a remaining portion of the first connection is automatically entered in the first text description of the first connection.

18. The method of claim 14, wherein:
   the system is a field-programmable gate array ("FPGA") system,
   the first element of the FPGA system has a first plurality of interface instantiations and the second element of the FPGA system has a second plurality of interface instantiations, and
   each of the first plurality of interface instantiations and each of the second plurality of interface instantiations is displayed in combination according to connection status in the FPGA system on the first visualization pane and on the second visualization pane.

19. A non-transitory computer-readable device storing computer-readable instructions, which, when executed by the computer, perform the method of claim 14.

* * * * *